United States Patent

Ogihara et al.

(10) Patent No.: US 9,207,535 B2
(45) Date of Patent: Dec. 8, 2015

(54) METHOD FOR PRODUCING RESIST COMPOSITION

(71) Applicant: SHIN-ETSU CHEMICAL CO., LTD., Tokyo (JP)

(72) Inventors: Tsutomu Ogihara, Jyoetsu (JP); Yusuke Biyajima, Jyoetsu (JP); Motoaki Iwabuchi, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/447,067

(22) Filed: Jul. 30, 2014

(65) Prior Publication Data

US 2015/0064625 A1 Mar. 5, 2015

(30) Foreign Application Priority Data

Sep. 2, 2013 (JP) .................................. 2013-181496

(51) Int. Cl.
*G03F 7/11* (2006.01)
*G03F 7/075* (2006.01)
(Continued)

(52) U.S. Cl.
CPC .............. *G03F 7/0757* (2013.01); *B01D 61/14* (2013.01); *B01D 61/145* (2013.01);
(Continued)

(58) Field of Classification Search
CPC ... G03F 7/0757; G03F 7/0755; C09D 183/04; C09D 183/06; C08L 83/04; C08G 77/04; B01D 61/14; B01D 61/145; B01D 61/147; B01D 61/22; B01D 61/18

USPC ................. 430/270.1, 271.1, 272.1; 427/387; 428/447; 524/588, 860; 528/10, 25, 27, 528/31, 32, 43

See application file for complete search history.

(56) References Cited

U.S. PATENT DOCUMENTS 4,770,977 A * 9/1988 Buiguez et al. ............... 430/323
4,886,728 A * 12/1989 Salamy et al. ................ 430/331

(Continued)

FOREIGN PATENT DOCUMENTS

| EP | 1574901 A1 | 9/2005 |
| EP | 1881371 A1 | 1/2008 |
| JP | B2-4716037 | 7/2011 |

OTHER PUBLICATIONS

Wu et al., Improving Advanced Lithography Process Defectivity with a Highly retentive 5nm Asymmetric UPE Filter, Entegris, Inc., pp. 1-6 (2009).*

(Continued)

*Primary Examiner* — Amanda C Walke
(74) *Attorney, Agent, or Firm* — Oliff PLC

(57) ABSTRACT

The present invention provides a method for producing a resist composition used in a process for producing a semiconductor apparatus, the method including the steps of:
cleaning an apparatus for producing the resist composition with a cleaning liquid;
applying the cleaning liquid on an evaluation substrate by spin-coating after removing the cleaning liquid from the apparatus for producing the resist composition;
repeating the step of cleaning and the step of applying until the change in the density of defects having a size of 100 nm or more on the evaluation substrate between before and after the application of the cleaning liquid becomes $0.2/cm^2$ or less; and
producing the resist composition by using the apparatus for producing the resist composition after the step of repeating.

There can be provided a method for producing a resist composition capable of producing a resist composition whose coating defects are reduced.

20 Claims, 2 Drawing Sheets

(51) Int. Cl.

| | |
|---|---|
| *C09D 183/06* | (2006.01) |
| *C08L 83/04* | (2006.01) |
| *C08G 77/04* | (2006.01) |
| *B01D 61/14* | (2006.01) |
| *B01D 61/22* | (2006.01) |
| *B01D 61/18* | (2006.01) |
| *G03F 7/09* | (2006.01) |
| *G03F 7/16* | (2006.01) |

(52) U.S. Cl.
CPC ............ *B01D 61/147* (2013.01); *B01D 61/18* (2013.01); *B01D 61/22* (2013.01); *C08G 77/04* (2013.01); *C08L 83/04* (2013.01); *C09D 183/06* (2013.01); *G03F 7/0752* (2013.01); *G03F 7/094* (2013.01); *G03F 7/16* (2013.01)

(56) References Cited

U.S. PATENT DOCUMENTS

| | | | | |
|---|---|---|---|---|
| 5,151,219 | A * | 9/1992 | Salamy et al. | 252/364 |
| 5,685,327 | A * | 11/1997 | Mohindra et al. | 134/95.2 |
| 5,814,433 | A * | 9/1998 | Nelson et al. | 430/326 |
| 5,847,905 | A * | 12/1998 | Inaba et al. | 360/128 |
| 6,147,010 | A * | 11/2000 | Whitman | 438/782 |
| 6,758,908 | B2 * | 7/2004 | Whitman | 118/697 |
| 6,884,462 | B2 * | 4/2005 | Whitman | 427/240 |
| 8,048,615 | B2 * | 11/2011 | Takei et al. | 430/313 |
| 8,835,102 | B2 * | 9/2014 | Ogihara et al. | 430/325 |
| 8,906,452 | B1 * | 12/2014 | Hillman | 427/240 |
| 2001/0041769 | A1 * | 11/2001 | Iwasawa et al. | 524/588 |
| 2003/0200996 | A1 * | 10/2003 | Hiatt et al. | 134/21 |
| 2006/0191854 | A1 * | 8/2006 | Sakillaris et al. | 210/746 |
| 2007/0238300 | A1 | 10/2007 | Ogihara et al. | |
| 2008/0023046 | A1 * | 1/2008 | Restelli et al. | 134/33 |
| 2008/0153040 | A1 * | 6/2008 | Honda | 430/319 |
| 2009/0253884 | A1 * | 10/2009 | Ogawa et al. | 528/10 |
| 2010/0167212 | A1 * | 7/2010 | Cho et al. | 430/313 |
| 2010/0297551 | A1 * | 11/2010 | Teranishi | 430/270.1 |
| 2012/0129352 | A1 * | 5/2012 | Mori et al. | 438/703 |
| 2013/0108957 | A1 | 5/2013 | Iwabuchi et al. | |
| 2013/0108958 | A1 | 5/2013 | Ogihara et al. | |
| 2014/0054738 | A1 * | 2/2014 | Yamamoto et al. | 257/432 |
| 2014/0148536 | A1 * | 5/2014 | Kawabata et al. | 524/101 |
| 2014/0335453 | A1 * | 11/2014 | Ogihara et al. | 430/270.1 |

OTHER PUBLICATIONS

Jan. 23, 2015 Extended European Search Report issued in European Application No. 14003007.3.

* cited by examiner

METHOD FOR PRODUCING RESIST COMPOSITION

BACKGROUND OF THE INVENTION

1. Field of the Invention

The present invention relates to a method for producing a resist composition used in finer processing in a process for producing a semiconductor apparatus including a semiconductor device, particularly a composition for a resist film used in multilayer resist method.

2. Description of the Related Art

Amid LSI's technological development of higher integration and higher speed, fine patterning with a smaller dimension of a circuit pattern has rapidly been developed. Accordingly, lithography technology has achieved fine patterning by using a light source of a shorter wavelength and by appropriately selecting a resist composition according thereto.

When a finer patterning is conducted (i.e. making a pattern width smaller) by using the same light source and a photoresist film having the same thickness as conventional patterning, the aspect ratio of a photoresist pattern after development is larger, resulting in pattern collapse. Thus, the photoresist film has been made thinner in accordance with finer patterning to put the aspect ratio of the photoresist pattern within a proper range. Unfortunately, introduction of a thinner photoresist film caused additional technical problem that a precision of a pattern transferring to a substrate to be processed becomes lower.

One of the methods for solving these problems is multilayer resist method. In this method, an underlayer film whose etching selectivity is different from a photoresist film, i.e. a resist upper layer film, is interposed between the resist upper layer film and a substrate to be processed, then a pattern is formed on the resist upper layer film, then the pattern is transferred to the underlayer film by etching using the upper layer resist pattern as an etching mask, and the pattern is transferred to the substrate to be processed by etching using the underlayer film as an etching mask.

In recent years, a silicon-containing resist underlayer film has been used as a resist underlayer film in multilayer resist method (Patent Document 1). The silicon-containing resist underlayer film is excellent in processing performance due to its easy coating property and etching selectivity that is different from an upper layer resist. However, in a composition for forming a silicon-containing resist underlayer film, which is different from a silicon-free organic film composition such as a conventional photoresist composition, once the composition for forming a silicon-containing resist underlayer film begins condensation of a polymer and becomes a higher molecular weight polymer in a pipe or a filter, a solvent-insoluble deposit will be generated. This is derived from a silicon-containing polymer contained in the composition for forming a silicon-containing resist underlayer film. The deposit of the polymer is generally called "siloxane gel", and its size is significantly small. Therefore the deposit can readily pass through even a filter (approximately 20 nm in diameter) connected to a discharge pipe of a coating apparatus for forming a silicon-containing film, and the deposit is observed as a defect in a silicon-containing coating film formed on a substrate for producing a semiconductor apparatus.

A defect in a coating film is found in the form of minute unevenness generated when a resist composition is applied on a substrate for producing a semiconductor apparatus. A defect contained in a resist film, particularly in a silicon-containing resist underlayer film affects a pattern of a resist upper layer film, frequently leading to a pattern defect. When the pattern defect is transferred to a substrate to be processed for a semiconductor apparatus by dry etching, a circuit in the semiconductor apparatus produced shows electrical faults such as open abnormality and short abnormality. In fact, the pattern defect is a cause of declining yield of semiconductor apparatuses. A currently used method for effectively removing the siloxane gel generated in a pipe or a filter is only filtration by using a filter. Since a filter cannot sufficiently remove a particularly small defect, more effective means is being required.

PRIOR ART DOCUMENT

Patent Document

Patent Document 1: Japanese Patent No. 4716037

SUMMARY OF THE INVENTION

The present invention was made in view of the above situation, and has an object to provide a method for producing a resist composition capable of producing a resist composition whose coating defects are reduced.

To solve the problems as mentioned above, the present invention provides a method for producing a resist composition used in a process for producing a semiconductor apparatus, comprising the steps of:

cleaning an apparatus for producing the resist composition with a cleaning liquid;

applying the cleaning liquid on an evaluation substrate by spin-coating after removing the cleaning liquid from the apparatus for producing the resist composition;

repeating the step of cleaning and the step of applying until the change in the density of defects having a size of 100 nm or more on the evaluation substrate between before and after the application of the cleaning liquid becomes $0.2/cm^2$ or less; and producing the resist composition by using the apparatus for producing the resist composition after the step of repeating.

By using the method for producing a resist composition in which an apparatus for producing a resist composition is cleaned until the change in the number of defects per unit area (hereinafter referred to as "the density of defects") on an evaluation substrate between before and after the application of the cleaning liquid becomes $0.2/cm^2$ or less on condition that the minimum defect size that can be detected on the evaluation substrate is 100 nm or more (hereinafter referred to as "condition of 100 nm or more"), a resist composition whose coating defects are reduced can be produced. Since the coating defects of the resist composition thus produced are reduced, the resist composition can preferably be used for liquid immersion exposure, double patterning and organic solvent development etc.

Preferably, the apparatus for producing a resist composition comprises a production filter, and a raw material of the resist composition is fed to the apparatus for producing a resist composition just after the step of repeating to produce the resist composition.

The method for producing a resist composition like this can produce a resist composition whose coating defects are more reduced.

Additionally, the apparatus for producing a resist composition may be cleaned by the step of repeating until the change in the density of defects on an evaluation substrate between before and after the application of the cleaning liquid becomes $1/cm^2$ or less on condition that the minimum defect size that can be detected on the evaluation substrate is 80 nm or more (hereinafter referred to as "on condition of 80 nm or more").

In addition, the apparatus for producing a resist composition may be cleaned by the step of repeating until the change in the density of defects on an evaluation substrate between before and after the application of the cleaning liquid becomes 2/cm$^2$ or less on condition that the minimum defect size that can be detected on the evaluation substrate is 60 nm or more (hereinafter referred to as "on condition of 60 nm or more").

By cleaning the apparatus for producing a resist composition like this, a resist composition whose coating defects are more reduced can be produced in accordance with the situation.

The cleaning liquid is preferably an organic solvent.

By using the cleaning liquid like this, defects in the apparatus for producing a resist composition can efficiently be removed.

In addition, the resist composition is preferably a silicon-containing composition.

The method for producing a resist composition of the present invention can preferably be used, particularly in the production of a resist composition containing silicon which easily becomes a higher molecular weight polymer.

Moreover, the evaluation substrate is preferably a silicon wafer.

By using the evaluation substrate like this, the change in the density of defects between before and after the application of the cleaning liquid in the production of a resist composition can readily be evaluated.

The method for producing a resist composition of the present invention can produce a resist composition whose coating defects are reduced. The resist composition thus produced, particularly a composition for forming a silicon-containing resist underlayer film can reduce coating defects generated when the resist composition is applied on a substrate for producing a semiconductor apparatus. Accordingly, defect-free pattern transferring can be made when an upper layer photoresist pattern formed is transferred to a silicon-containing resist underlayer film and then to an organic underlayer film by using dry etching process. Therefore, the resist composition can preferably be used, particularly for liquid immersion exposure, double patterning and organic solvent development in multilayer resist method to eventually improve the yield of semiconductor apparatuses to be produced.

DETAILED DESCRIPTION OF THE PREFERRED EMBODIMENTS

Figure 1:
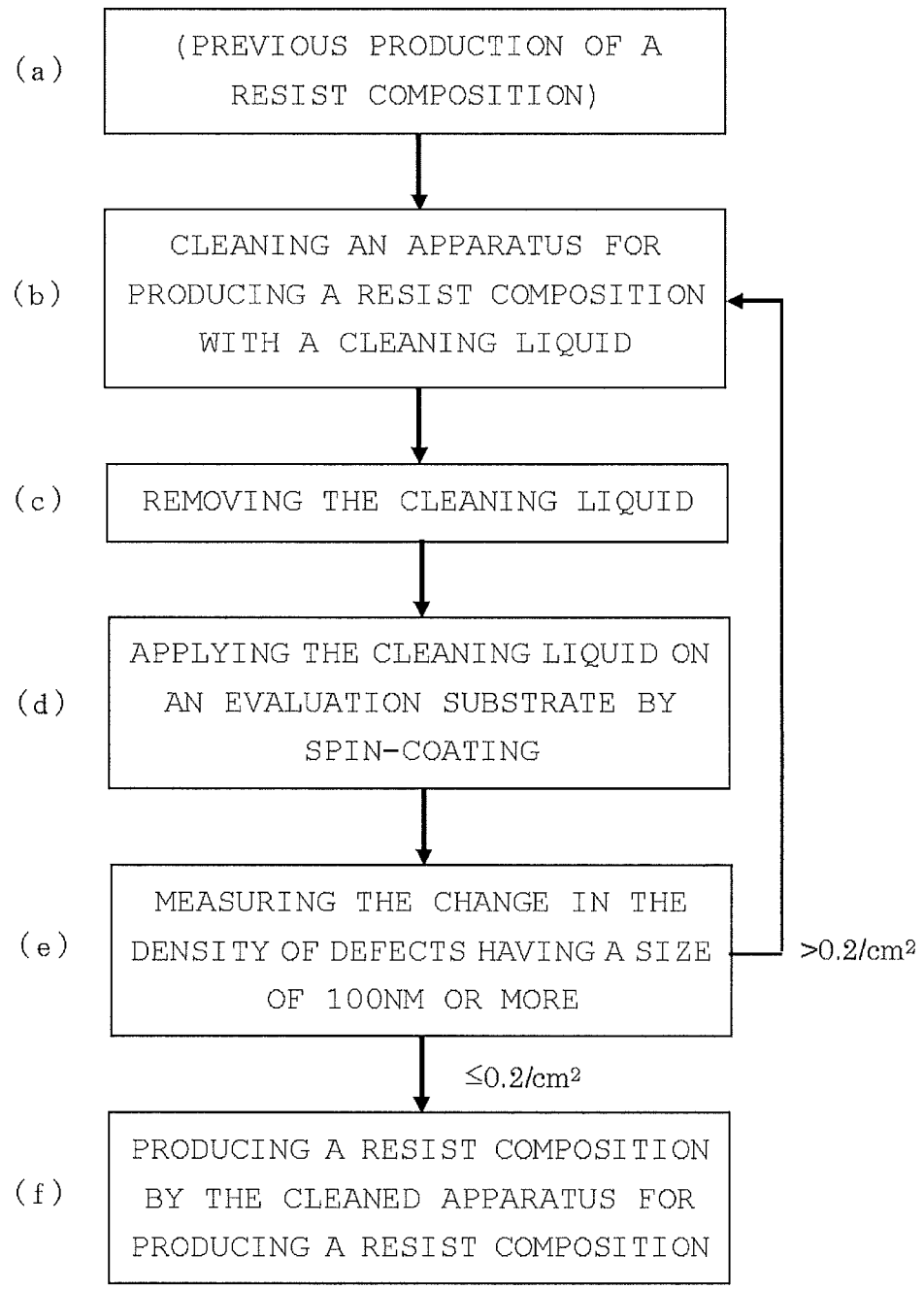
FIG. 1 is a flow chart of a method for producing a resist composition of the present invention.

Conventionally, lithography characteristics and stability of compositions for forming a silicon-containing resist underlayer film used in multilayer resist method have been examined and a composition for forming a silicon-containing resist underlayer film shown in Japanese Patent No. 4716037 has been provided. However, as described above, finer patterning of a circuit in a semiconductor apparatus has become more advanced as finer patterning of an upper layer resist has been promoted. Consequently, a coating film whose defects are more reduced is increasingly required for a silicon-containing resist underlayer film provided by spin-coating.

When silicon-containing resist compositions are continuously produced, residual polysiloxane in a preparation tank and a pipe (hereinafter referred to as "apparatus for producing a resist composition") will normally become a higher molecular weight polymer and then turns into an insoluble polysiloxane gel in the apparatus for producing a resist composition until the next production process starts. In the production of another resist composition, the insoluble polysiloxane gel will be mixed with raw materials fed, resulting in coating defects. Inventors of the present invention found that when a resist composition is produced with assuredly less siloxane gel, mixing of an insoluble polysiloxane gel in the apparatus for producing a resist composition can be suppressed, and a resist film whose coating defects are reduced can be formed.

Inventors of the present invention have carried out extended research for reducing these defects and found a method for producing a resist composition capable of stably forming a coating film whose defects are reduced by: applying a cleaning liquid for cleaning an apparatus for producing a resist composition on an evaluation substrate having a clean surface such as a silicon wafer when a conventional composition for forming a silicon-containing resist underlayer film is produced; measuring the number of defects on the evaluation substrate; and cleaning the apparatus for producing a resist composition until the change in the density of defects is under a predetermined value. Based on that information, the present invention was accomplished.

The present invention provides a method for producing a resist composition used in a process for producing a semiconductor apparatus, comprising the steps of:

cleaning an apparatus for producing the resist composition with a cleaning liquid;

applying the cleaning liquid on an evaluation substrate by spin-coating after removing the cleaning liquid from the apparatus for producing the resist composition;

repeating the step of cleaning and the step of applying until the change in the density of defects having a size of 100 nm or more on the evaluation substrate between before and after the application of the cleaning liquid becomes 0.2/cm$^2$ or less; and producing the resist composition by using the apparatus for producing the resist composition after the step of repeating.

The present invention will be described with reference to the drawings.

In the following description, as a preferred example, the case that a silicon-containing composition, i.e. a composition for forming a silicon-containing film, is produced as a resist composition is described.

FIG. 1 is a flow chart of a method for producing a resist composition of the present invention.

Figure 2:
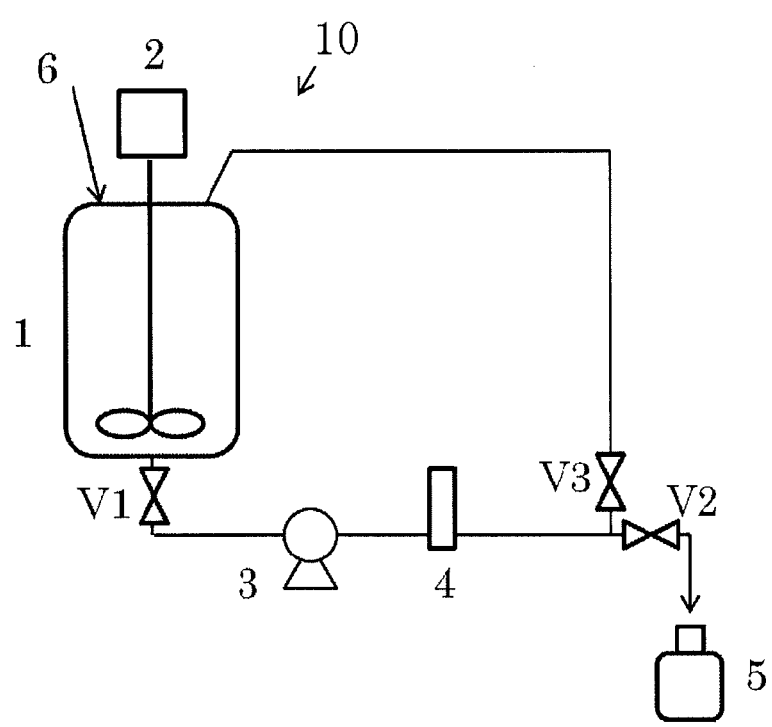
FIG. 2 is a schematic diagram showing an example of an apparatus for producing a resist composition used in the present invention.

First, in process (a), a composition for forming a silicon-containing film is produced beforehand by using an apparatus for producing a resist composition 10 shown in FIG. 2.

The apparatus for producing a resist composition 10 comprises a preparation tank 1 having an agitator 2 and a feeding port 6, a feed pump 3 connected from the preparation tank 1 via a pipe having a tank valve V1, a strainer 4 for filtrating a cleaning liquid or a composition for forming a silicon-containing film fed from the feed pump 3, an extraction valve V2 for feeding the composition for forming a silicon-containing film filtrated in the strainer 4 to a product container 5, and further a circulating valve V3 for circulating a cleaning liquid fed from the feeding port 6 of the preparation tank 1 when cleaning and a pipe for feeding the cleaning liquid. Specifically, the strainer 4 may be provided with a later-described production filter for removing a foreign object, or a production filter and a filter for cleaning may be different.

After producing a composition for forming a silicon-containing film in process (a) beforehand, the apparatus for producing a resist composition 10 is provided with a residual polysiloxane in the preparation tank 1 or pipes connecting between equipments, and the residual polysiloxane is dried, becomes a higher molecular weight polymer, and turn into a siloxane gel. The siloxane gel unfortunately acts on polysiloxane as a raw material of a composition for forming a silicon-containing film fed in another production process to promote becoming a higher molecular weight polymer and encourage generation of a polysiloxane gel causing coating defects.

Next, in process (b), the apparatus for producing a resist composition 10 is cleaned with a cleaning liquid. Accordingly, defects such as polysiloxane in the preparation tank 1 and each pipe are cleaned and removed. Preferably, a later-mentioned production filter is placed at the strainer 4 to increase the degree of cleanliness in the process (b), or the production filter used in the process (a) is replaced with another filter.

An organic solvent is preferably used as a cleaning liquid.

Illustrative example of the organic solvent used in cleaning is a commonly known organic solvent, including: alcohols such as methanol, ethanol, propanol, butanol, methoxy ethanol, butoxy ethanol, methoxy propanol and ethoxy propanol; ketones such as acetone, methyl ethyl ketone and cyclohexanone; ethers such as tetrahydrofuran, dioxane, ethylene glycol dimethyl ether and diethylene glycol dimethyl ether; esters such as ethyl acetate, butyl acetate, ethyl lactate, ethyl cellosolve acetate, propylene glycol methyl ether acetate and gamma butyrolactone; aromatic compounds such as benzene, toluene and xylene; and chlorinated hydrocarbons such as dichloromethane, dichloroethane, dichloroethylene and trichloroethylene, and preferably alcohols such as methanol, ethanol, propanol, butanol, methoxy ethanol, butoxy ethanol, methoxy propanol and ethoxy propanol; ketones such as acetone, methyl ethyl ketone and cyclohexanone; ethers such as tetrahydrofuran, dioxane, ethylene glycol dimethyl ether and diethylene glycol dimethyl ether; and esters such as ethyl acetate, butyl acetate, ethyl lactate, ethyl cellosolve acetate, propylene glycol methyl ether acetate and gamma butyrolactone can be used.

Moreover, a cleaning liquid obtained by including water in the above organic solvent may be used. Accordingly, a water-soluble defect, polysiloxane and a higher molecular weight polymer which are difficult to clean and remove by using an organic solvent only can be cleaned in an active manner.

Next, in process (c), a cleaning liquid is removed from the apparatus for producing a resist composition 10.

Illustrative example of the method for removing the cleaning liquid from the apparatus for producing a resist composition 10 shown in FIG. 2 includes a method for removing the cleaning liquid by releasing the extraction valve V2 and a method for collecting the cleaning liquid from the feeding port 6 of the preparation tank 1.

Subsequently, in process (d), the cleaning liquid removed is applied by spin-coating on an evaluation substrate.

Particularly, when a composition for forming a silicon-containing film is produced as a resist composition, a silicon wafer is preferably used as the evaluation substrate. Use of a silicon wafer can readily measure the change in the density of defects in the cleaning liquid, particularly in the density of defects derived from polysiloxane.

The spin-coating method is not particularly restricted, but the one used in spin-coating a resist composition on a substrate to be processed can be used.

Next, in process (e), the change in the density of defects on an evaluation substrate is measured.

Illustrative example of a conventional method for detecting a residual siloxane gel in an apparatus for producing a composition for forming a silicon-containing film includes a method for measuring a residue by weight by using GPC and evaporation drying method. However, RI detector in GPC and gravimetric method in evaporation drying method can provide a low sensitivity or a low detection limit of approximately 10 ppm. In fact, these methods cannot detect the residual siloxane gel unless it is a large one, or a small one in large quantities.

In the present invention, an apparatus for producing a resist composition is cleaned with a cleaning liquid, the cleaning liquid is removed from the apparatus for producing a resist composition and applied by spin-coating on an evaluation substrate, and the change in the density of defects on the evaluation substrate between before and after the application of the cleaning liquid is measured to detect defects in the apparatus for producing a resist composition.

The change in the density of defects on the evaluation substrate between before and after the application of the cleaning liquid can be calculated by obtaining a difference between the numbers of defects on the evaluation substrate before and after the application of the cleaning liquid. Illustrative example of the method for measuring the numbers of defects on the evaluation substrate before and after the application of the cleaning liquid includes a commonly used method for measuring the numbers of defects on a substrate, specifically a method for measuring the number(s) of defects by using a defect detecting apparatus such as dark-field defect detecting apparatus SP-2 (manufactured by KLA-Tencor Corporation).

The above method can detect the density of defects in an apparatus for producing a resist composition with high sensitivity. Particularly, since the density of defects can be measured as in the use of a resist composition, the precision is extremely high. Specifically, the density of defects can be detected by using the following degree of sensitivity.

When a silicon wafer 200 mm in diameter includes 100 defects of 100 nm, the area covered by the defects is given as follows by assuming that a defect is a square.

$$(100 \times 10^{-9})^2 \times 100/(3.14 \times (100 \times 10^{-3})^2) = 3.2 \times 10^{-11} = 0.03 \text{ ppb}$$

As illustrated above, a more significant improvement in detection sensitivity has been achieved than a conventional detecting method (sensitivity: approximately 10 ppm).

The change in the density of defects in a cleaning liquid after cleaning an apparatus for producing a resist composition is more effective as it is smaller, but in fact, it is hard to eliminate all micro defects. In the present invention, 3 specific criteria are provided according to intended use of a resist composition.

The change in the density of defects having a size of 100 nm or more is $0.2/\text{cm}^2$ or less.

The change in the density of defects having a size of 80 nm or more is $1/\text{cm}^2$ or less.

The change in the density of defects having a size of 60 nm or more is $2/\text{cm}^2$ or less.

The above criteria can be selected according to intended use of a resist composition, i.e. shape, line width and layout etc. of a circuit pattern.

When the change in the density of defects on an evaluation substrate measured in process (e) exceeds 0.2/cm$^2$ on condition of 100 nm or more (>0.2/cm$^2$), the apparatus for producing a resist composition is again subjected to: cleaning with a cleaning liquid in process (b); removing the cleaning liquid in process (c); applying the cleaning liquid on an evaluation substrate by spin-coating in process (d); and measuring the change in the density of defects in process (e). The above steps are repeated until the change in the density of defects becomes 0.2/cm$^2$ or less. After the change in the density of defects becomes 0.2/cm$^2$ or less (≤0.2/cm$^2$), the process can go to the next step (f). The size of defects measured can be selected according to shape, line width and layout etc. of a circuit pattern as stated above to determine the process conditions. The reference values of the change in the density of defects in each defect size are 1/cm$^2$ or less on condition of 80 nm or more, and 2/cm$^2$ or less on condition of 60 nm or more.

In process (f), a composition for forming a silicon-containing film (resist composition) is produced in the apparatus for producing a resist composition.

A raw material of a composition for forming a silicon-containing film is fed from the feeding port 6 to the preparation tank 1, and equally mixed to prepare a composition for forming a silicon-containing film. Illustrative example of the raw material of a composition for forming a silicon-containing film includes a composition shown in Japanese Patent No. 4716037.

A composition for forming a silicon-containing film prepared is fed through a strainer 4 and a production filter placed at the strainer 4 to remove a foreign object.

The diameter of the production filter can be selected according to the degree of cleanliness of a product (resist composition). For example, a filter whose diameter is 20 nm or less can be used on condition of 100 nm or more, and a filter whose diameter is 10 nm or less can be used on condition of 60 nm or more.

Illustrative example of a material of the production filter includes fluorocarbon, cellulose, nylon, polyester and hydrocarbon, and preferably includes a filter formed by fluorocarbon (known as Teflon (trade mark)), hydrocarbon such as polyethylene and polypropylene and nylon in a process for filtrating a resist composition.

Thereafter, an extraction valve V2 is released, and a composition for forming a silicon-containing film prepared and filtered is fed to the product container 5 to complete a process for producing a composition for forming a silicon-containing film. As required, the degree of cleanliness of the composition for forming a silicon-containing film may be examined before feeding the composition for forming a silicon-containing film to the product container 5.

A composition for forming a silicon-containing film is produced in the above preferred embodiment, but a resist composition produced in the present invention is not particularly restricted. Any resist composition, particularly any resist composition used in multilayer resist method can be employed.

The method for producing a resist composition can more accurately measure the degree of cleanliness in an apparatus for producing a resist composition than a conventional method. A residue generated in the previous production process in the apparatus for producing a resist composition can be cleaned and removed until the change in the density of defects becomes a predetermined value by using a defect detecting apparatus. Consequently, a resist composition whose coating defects are reduced can assuredly be produced. In addition, since coating defects of the resist composition thus obtained are reduced, the resist composition can preferably be used for liquid immersion exposure, double patterning and organic solvent development, and the yield of semiconductor apparatuses produced can be improved.

EXAMPLES

The present invention will be described in more detail with reference to Examples and Comparative Examples, but the present invention is not restricted thereto.

Example 1

A composition for forming a silicon-containing resist underlayer film was produced using an apparatus for producing a resist composition shown in FIG. 2. A polyethylene filter cartridge of 20 nm in diameter was placed at a strainer 4, and 20 L of propylene glycol methyl ether acetate (PGMEA) was fed from a feeding port 6 of a 10 L preparation tank 1 as a cleaning liquid. After the cleaning liquid was agitated by an agitator 2 for 1 hour, the agitator 2 was stopped to open a tank valve V1 and a circulating valve V3 and close an extraction valve V2. Then, a feed pump 3 was started to circulate the PGMEA for 24 hours. The PGMEA was discharged from the apparatus with the extraction valve V2 open. This operation was repeated one more time. When the PGMEA was discharged from the apparatus, it was collected in a clean glass bottle. The PGMEA was applied by spin-coating on a silicon wafer of 300 mm in diameter at a revolution speed of 1500 rpm by using a CLEAN TRACK ACT12 (manufactured by Tokyo Electron Limited.: hereinafter referred to as ACT12), and then the wafer was dried by spin-dry. As for a surface defect of the wafer, when the number of coating defects of 100 nm or more was measured with a dark-field defect detecting apparatus SP-2 (manufactured by KLA-Tencor Corporation: hereinafter referred to as SP-2), the number of the defects on the wafer was 80 (0.011 ppb or less), and the change in the number of defects by obtaining a difference in the number of the defects measured before and after the application of the cleaning liquid was 77, and the change in the density of defects was 0.11/cm$^2$.

Example 2

The cleaning conditions of Example 1 were used except for a different polyethylene filter cartridge of 10 nm in diameter to be placed at a strainer 4. When the number of coating defects of 80 nm or more (as surface defects) of the cleaning liquid was measured with SP-2, the number of the defects on a wafer was 110 (0.010 ppb or less), and the change in the number of the defects before and after the application of the cleaning liquid was 102, and the change in the density of defects was 0.14/cm$^2$.

Example 3

The cleaning conditions of Example 1 were used except for a different polyethylene filter cartridge of 3 nm in diameter to be placed at a strainer 4. When the number of coating defects of 60 nm or more (as surface defects) of the cleaning liquid was measured with SP-2, the number of the defects on a wafer was 240 (0.012 ppb or less), and the change in the number of the defects before and after the application of the cleaning liquid was 220, and the change in the density of defects was 0.31/cm$^2$.

Example 4

The cleaning conditions of Example 3 were used except for a different cleaning liquid of propylene glycol ethyl ether (hereinafter referred to as PGEE). When the number of coating defects of 60 nm or more (as surface defects) of the cleaning liquid (PGEE) was measured with SP-2, the number of the defects on a wafer was 190 (0.009 ppb or less), and the change in the number of the defects before and after the application of the cleaning liquid was 172, and the change in the density of defects was 0.24/cm².

Comparative Example 1

A composition for forming a silicon-containing resist underlayer film was produced using the following apparatus for producing a resist composition. A filter cartridge was not placed at a strainer 4 and 20 L of PGMEA (cleaning liquid) was fed from a feeding port 6 of a 100 L preparation tank 1. After the cleaning liquid was agitated by an agitator 2 for 1 hour, the agitator 2 was stopped to open a tank valve V1 and a circulating valve V3 and close an extraction valve V2. Then, a feed pump 3 was started to circulate the PGMEA for 24 hours. The PGMEA was collected in a clean glass bottle with the extraction valve V2 open. The PGMEA was applied by spin-coating on a silicon wafer of 300 mm in diameter at a revolution speed of 1500 rpm by using ACT12, and then the wafer was dried by spin-dry. As for a surface defect of the wafer, when the number of coating defects of 100 nm or more was measured with a SP-2, the number of the defects on the wafer was 160 (0.023 ppb or less), and the change in the number of defects by obtaining a difference in the number of the defects measured before and after the application of the cleaning liquid was 158, and the change in the density of defects was 0.22/cm².

1 kg of the each cleaning liquid collected in the above Examples 1 to 4 and Comparative Example 1 was measured off in a beaker and the weight of defects (polysiloxane polymer) in the cleaning liquid was measured from the change in the weight of the beaker between before and after drying the beaker at 150° C. in nitrogen atmosphere (evaporation drying method). It was only found that the weight of the defects in each example was 10 ppm or less.

Thus, since the weight of a residual polysiloxane in a cleaning liquid was a measuring limit or less in conventional evaporation drying method with a cleaning liquid, it was found impossible to find out the degree of the residue.

Next, 16 kg of PGEE solution of 10% by mass polysiloxane shown by the following formula, 64 kg of PGEE and 8 kg of deionized water were added to the apparatus for producing a resist composition 10 cleaned in the Examples 1 to 4 and Comparative Example 1 and agitated by the agitator 2 for 1 hour. The agitator 2 was stopped to open the tank valve V1 and the circulating valve V3 and close the extraction valve V2. Then, a feed pump 3 was started to circulating-filtrate the raw materials for 176 hours at the speed of 10 kg/h. A silicon-containing resist underlayer film composition produced was filled in a clean glass bottle with the extraction valve V2 open. Each of silicon-containing resist underlayer film composition obtained in an apparatus for producing a resist composition of Examples 1 to 4 and Comparative Example 1 was applied by spin-coating on a silicon wafer at a revolution speed of 1500 rpm by using ACT12 and heated at 240° C. for 60 seconds to obtain a silicon-containing resist underlayer film 35 nm in thickness. The number of coating defects of 60 nm or more (as surface defects) of the coating film was measured with SP-2 (coating film defect).

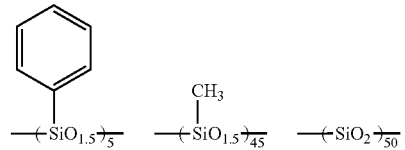

Positive Development Patterning Test

A spin-on carbon film ODL-50 (manufactured by Shin-Etsu Chemical Co., Ltd.: carbon content; 80% by mass) was formed with a film thickness of 200 nm on a silicon wafer. Each of the composition for forming a silicon-containing resist underlayer film obtained in the apparatus for producing a resist composition of Examples 1 to 4 and Comparative Example 1 was applied thereon and heated at 240° C. for 60 seconds to prepare a coating film with a film thickness of 35 nm. Subsequently, an ArF resist solution for positive development (PR-1) described in Table 1 was applied thereon and baked at 110° C. for 60 seconds to form a photoresist layer with a film thickness of 100 nm. Moreover, a liquid immersion top coat (TC-1) described in Table 2 was further applied on the photoresist film and baked at 90° C. for 60 seconds to form a top coat with a film thickness of 50 nm.

Subsequently, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass tetramethylammonium hydroxide (TMAH) aqueous solution for 30 seconds to obtain 43 nm 1:1 positive type line and space pattern.

Each pattern defect was observed by a bright-field defect detecting apparatus KLA2800 (manufactured by KLA-Tencor Corporation) (pattern defect).

TABLE 1

| No. | Polymer (parts by mass) | Acid generator (parts by mass) | Base (parts by mass) | Solvent (parts by mass) |
|---|---|---|---|---|
| PR-1 | ArF resist polymer 1 (100) | PAG1 (7.0) | Quencher (1.0) | PGMEA (2,500) |

ArF resist polymer 1:

Molecular weight (Mw)=7,800

Degree of dispersion (Mw/Mn)=1.78

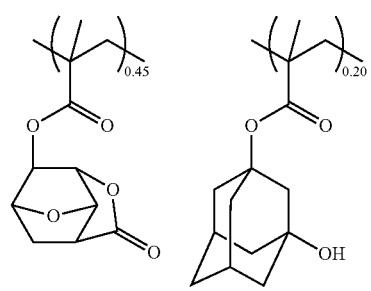

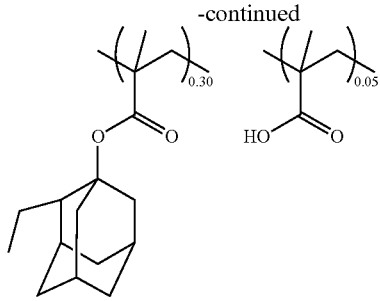

Acid generator: PAG1

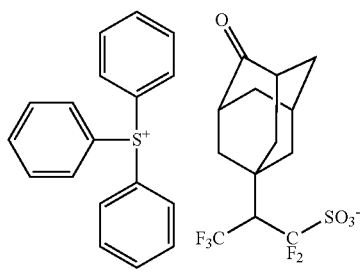

Base: Quencher

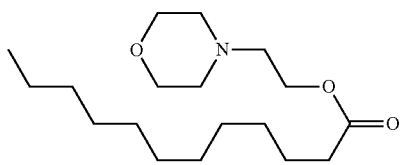 [SMILES: CCCCCCCCCCCC(=O)OCCN1CCOCC1]

Top Coat Polymer
  Molecular weight (Mw)=8,800
  Degree of dispersion (Mw/Mn)=1.69

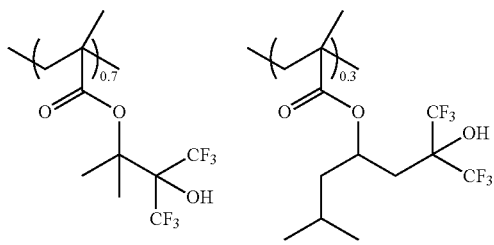

TABLE 2

| | Polymer (parts by mass) | Organic solvent (parts by mass) |
|---|---|---|
| TC-1 | Top coat polymer (100) | diisoamyl ether (2700) 2-methyl-1-butanol (270) |

The degree of cleanliness of a cleaning liquid (number of defects on a wafer), the change in the density of defects, the coating film defect and pattern defect on each condition of the above Examples 1 to 4 and Comparative Example 1 are shown in the following Table 3.

TABLE 3

| Condition | | Degree of cleanliness of cleaning liquid (Number of defects on wafer) | Change in the density of defects (/cm$^2$) | Coating film defect | Pattern defect |
|---|---|---|---|---|---|
| Example 1 | 100 nm or more | 80 | 0.11 | 20 | 10 |
| Example 2 | 80 nm or more | 110 | 0.14 | 10 | 5 |
| Example 3 | 60 nm or more | 240 | 0.31 | 5 | 3 |
| Example 4 | 60 nm or more | 190 | 0.24 | 5 | 2 |
| Comparative Example 1 | 100 nm or more | 160 | 0.22 | 160 | 50 |

Since the change in the density of defects on a silicon wafer (evaluation substrate) was lower than a predetermined value in the Examples 1 to 4, a defect on a coating film and a pattern defect when it was used as a resist underlayer film were reduced. In the Comparative Example 1, despite a condition of 100 nm or more, the change in the density of defects was higher than 0.2/cm$^2$; thereby a defect on a coating film and a pattern defect when it was used as a resist underlayer film significantly higher than the values in the Example 1 to 4.

These results show that the method for producing a resist composition of the present invention can more accurately measure the degree of cleanliness in an apparatus for producing a resist composition than a conventional method, and can produce a resist composition whose defects derived from defects such as coating film defects and pattern defects are reduced.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A method for producing a resist underlayer film-forming composition used in a process for producing a semiconductor apparatus, comprising the steps of:
   cleaning an apparatus for producing the resist underlayer film-forming composition with a cleaning liquid;
   applying the cleaning liquid on an evaluation substrate by spin-coating after removing the cleaning liquid from the apparatus for producing the resist underlayer film-forming composition;
   repeating the step of cleaning and the step of applying until the change in the density of defects having a size of 100 nm or more on the evaluation substrate between before and after the application of the cleaning liquid becomes 0.2/cm$^2$ or less; and
   feeding a raw material of the resist underlayer film-forming composition to the apparatus for producing the resist underlayer film-forming composition just after the step of repeating to produce the resist underlayer film-forming composition.

2. The method for producing a resist underlayer film-forming composition according to claim 1, wherein the apparatus for producing the resist underlayer film-forming composition comprises a production filter.

3. The method for producing a resist underlayer film-forming composition according to claim 1, wherein the apparatus for producing the resist underlayer film-forming composition is cleaned by the step of repeating until the change in the density of defects having a size of 80 nm or more on the evaluation substrate between before and after the application of the cleaning liquid becomes $1/cm^2$ or less.

4. The method for producing a resist underlayer film-forming composition according to claim 2, wherein the apparatus for producing the resist underlayer film-forming composition is cleaned by the step of repeating until the change in the density of defects having a size of 80 nm or more on the evaluation substrate between before and after the application of the cleaning liquid becomes $1/cm^2$ or less.

5. The method for producing a resist underlayer film-forming composition according to claim 1, wherein the apparatus for producing the resist underlayer film-forming composition is cleaned by the step of repeating until the change in the density of defects having a size of 60 nm or more on the evaluation substrate between before and after the application of the cleaning liquid becomes $2/cm^2$ or less.

6. The method for producing a resist underlayer film-forming composition according to claim 2, wherein the apparatus for producing the resist underlayer film-forming composition is cleaned by the step of repeating until the change in the density of defects having a size of 60 nm or more on the evaluation substrate between before and after the application of the cleaning liquid becomes $2/cm^2$ or less.

7. The method for producing a resist underlayer film-forming composition according to claim 3, wherein the apparatus for producing the resist underlayer film-forming composition is cleaned by the step of repeating until the change in the density of defects having a size of 60 nm or more on the evaluation substrate between before and after the application of the cleaning liquid becomes $2/cm^2$ or less.

8. The method for producing a resist underlayer film-forming composition according to claim 4, wherein the apparatus for producing the resist underlayer film-forming composition is cleaned by the step of repeating until the change in the density of defects having a size of 60 nm or more on the evaluation substrate between before and after the application of the cleaning liquid becomes $2/cm^2$ or less.

9. The method for producing a resist underlayer film-forming composition according to claim 1, wherein the cleaning liquid is an organic solvent.

10. The method for producing a resist underlayer film-forming composition according to claim 2, wherein the cleaning liquid is an organic solvent.

11. The method for producing a resist underlayer film-forming composition according to claim 3, wherein the cleaning liquid is an organic solvent.

12. The method for producing a resist underlayer film-forming composition according to claim 5, wherein the cleaning liquid is an organic solvent.

13. The method for producing a resist underlayer film-forming composition according to claim 1, wherein the resist underlayer film-forming composition is a silicon-containing composition.

14. The method for producing a resist underlayer film-forming composition according to claim 2, wherein the resist underlayer film-forming composition is a silicon-containing composition.

15. The method for producing a resist underlayer film-forming composition according to claim 3, wherein the resist underlayer film-forming composition is a silicon-containing composition.

16. The method for producing a resist underlayer film-forming composition according to claim 5, wherein the resist underlayer film-forming composition is a silicon-containing composition.

17. The method for producing a resist underlayer film-forming composition according to claim 1, wherein the evaluation substrate is a silicon wafer.

18. The method for producing a resist underlayer film-forming composition according to claim 2, wherein the evaluation substrate is a silicon wafer.

19. The method for producing a resist underlayer film-forming composition according to claim 3, wherein the evaluation substrate is a silicon wafer.

20. The method for producing a resist underlayer film-forming composition according to claim 5, wherein the evaluation substrate is a silicon wafer.

\* \* \* \* \*